United States Patent [11] 3,617,278

[72] Inventors Colin Holstead
Abbotts Langley, England;
Wojciech Maria Przezdziecki, Rochester, N.Y.
[21] Appl. No. 714,431
[22] Filed Mar. 20, 1968
[45] Patented Nov. 2, 1971
[73] Assignee Eastman Kodak Company
Rochester, N.Y.
[32] Priority Mar. 31, 1967
[33] Great Britain
[31] 14,955/67

[54] AZIDE SENSITIZERS AND PHOTOGRAPHIC ELEMENTS
15 Claims, No Drawings

[52] U.S. Cl. .......... 96/33, 96/36, 96/36.3, 96/36.4, 96/49, 96/75, 96/90, 96/115, 260/349
[51] Int. Cl. .......... G03f 7/08, G03c 1/52
[50] Field of Search .......... 96/91, 75, 49, 91 N, 33, 35.1, 36, 115, 90, 36.3, 36.4; 260/349

[56] References Cited

UNITED STATES PATENTS

| | | | |
|---|---|---|---|
| 1,845,989 | 2/1932 | Schmidt et al. | 96/91 |
| 2,852,379 | 9/1958 | Hepher et al. | 96/91 |
| 3,061,435 | 10/1962 | Tomanek et al. | 96/91 |
| 3,100,702 | 8/1963 | Rauner et al. | 96/91 X |
| 3,143,417 | 8/1964 | Reichel et al. | 96/91 X |
| 3,282,693 | 11/1966 | Sagura et al. | 96/91 X |
| 3,287,128 | 11/1966 | Lugasch | 96/91 X |
| 3,154,559 | 10/1964 | Grotta et al. | 96/91 X |
| 3,312,554 | 4/1967 | Wagner et al. | 96/114 |
| 3,475,176 | 10/1969 | Rauner | 96/35.1 X |

OTHER REFERENCES

Kosar, J. " Light-Sensitive Systems," p. 330– 336, 1965.

A. S. Dey et al. " Journal of Heterocyclic Chemistry," Vol. 2, 1965, p. 113– 119.

*Primary Examiner*—Norman G. Torchin
*Assistant Examiner*—Charles L. Bowers, Jr.
*Attorneys*—W. H. J. Kline, J. R. Frederick and D. M. DeLeo

ABSTRACT: A light-sensitive azido substituted trihalomethane compound is employed in photographic elements with a polymer wherein both positive or negative images are obtained with utility in photomechanical reproduction and photoresist applications.

AZIDE SENSITIZERS AND PHOTOGRAPHIC ELEMENTS

This invention relates to photography and especially to positive-working and negative-working, azide-sensitized photographic elements having particular utility in the photomechanical reproduction and photoresist arts.

Photographic elements incorporating azide-sensitized, light hardenable polymers are well known. Such negative-working elements are prepared by coating a support with an azide sensitizer and a polymer. After exposure, the unhardened polymer is removed by solvent development, leaving an exposed, imagewise distribution of hydrophobic, ink-receptive polymer on the support material. Such developed photographic elements can, depending on the choice of support, choice of polymer and coating thickness, function as masters for lithographic printing, as masters for relief printing, or as resist stencils for etching operations.

Positive-working photographic elements for photomechanical and photoresist operations are also known in the art. Their preparation involves coating a support material with an diazo sensitizer-alkali-soluble polymer mixture. Exposure to light increases the alkali solubility of the initially alkali-soluble polymer, so that subsequent development in a dilute alkaline solution removes the more alkali-soluble polymer in the areas of exposure. The undissolved polymer image is a positive reproduction of the original pattern, and such a developed photographic element can produce positive copies by photomechanical means, such as lithographic printing.

The sensitizers utilized in conventional negative-working systems, on the one hand, are typically restricted to diazide compounds, particularly aryl bis-azides. In positive-working systems, on the other hand, high sensitizer concentrations are needed to assure adequate photographic response, the amount of sensitizer often equaling the polymer's weight. Additionally, current positive-working photographic elements which exhibit utility in photomechanical reproduction are restricted to initially alkali-soluble polymers, such as phenol-aldehyde polymers (e.g., resole type) which are rendered additionally alkali-soluble upon exposure to ultraviolet light.

Accordingly, an object of this invention is to provide novel azide sensitizers which are advantageously employed in light-sensitive photographic elements designed particularly for photomechanical reproduction and photoresist purposes.

It is another object of this invention to provide, for photomechanical reproduction and photoresist purposes, new positive-working photographic elements incorporating decreased amounts of an azide sensitizer.

Still another object of the present invention is to provide, for photomechanical reproduction and photoresist purposes, novel positive-working photographic elements utilizing substantially nonalkali soluble polymers.

Yet another object of the instant invention is to provide new photographic masters for lithographic printing.

Still another object of this invention is to provide novel photographic masters for relief printing.

An additional object of the present invention is to provide new photoresist stencils for etching purposes.

Yet an additional object of this invention is to provide a new photographic process for the preparation of lithographic and relief printing plates.

Still another object of the present invention is to provide a novel photographic process for the production of photoresist stencils.

It is also an object of this invention to provide a new cross-linking azido compound for light-sensitive photographic elements.

Still additional objects will become apparent from a consideration of the following description and appended claims.

The objects of this invention are accomplished with azido-substituted trihalomethanes. The azido-substituted trihalomethanes of the subject invention are light sensitive, and they function advantageously in both negative-working and positive-working photographic elements when coated on a support, particularly in combination with a polymer material.

Certain of these azido-substituted trihalomethanes which possess particular utility in photomechanical reproduction and etching operations include compounds having the formulas:

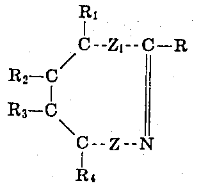

and

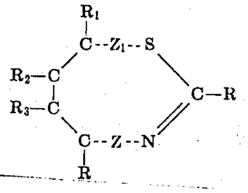

wherein R is a trihalomethyl radical, and each of $R_1$, $R_2$, $R_3$ and $R_4$ is either an azido radical, a halogen atom or a hydrogen atom, with at least two adjacent substituents in that group being a halogen atom and an azido radical, Z and $Z_1$ represent the carbon and hydrogen atoms necessary to complete a bicyclic or other polycyclic, heterocyclic nucleus having nine to 18 atoms.

Exemplary of the subject azido-substituted trihalomethanes are compounds such as those having the formulas:

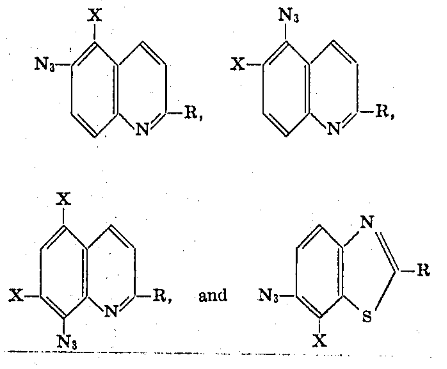

wherein R is a trihalomethyl radical and X is a halogen atom. Preferred compounds include 6-azido-5-bromo-2-tribromomethylquinoline; 5-azido-6,8-dibromo-2-tribromomethylquinoline; 8-azido-5,7-dibromo-2 tribromomethylquinoline; and 6-azido-7-bromo-2-tribromomethylbenzothiazole.

The above described azido-substituted trihalomethanes are advantageously employed in negative-working photographic elements, wherein a light-sensitive layer that includes the azido-substituted trihalomethane as a sensitizer and an unsaturated polymer is coated on a support. A wide variety of polymers can be advantageously employed in the negative-working photographic elements described herein.

Suitable polymers include such unsaturated polyesters derived from polyols and unsaturated polycarboxylic acids as are described in the copending application of Mench et al., Ser. No. 693,710, titled Photographic Element and Process, which was filed Dec. 27, 1967. Polyols which are advantageously employed in producing the polyesters utilized in this invention include both aliphatic and alicyclic polyols. Suitable aliphatic polyols can be, for example, such polyhydroxy compounds as lower alkane glycols having from one to six carbon atoms and homopolymers or copolymers of hydroxy substituted lower alkyl acrylate esters wherein the alkyl moiety has from one to six carbon atoms. Specific aliphatic polyols which exhibit particular utility in preparing the subject polyesters are, for example, ethylene glycol, 2,2-di(4-hydroxyethylphenyl)-propane, neopentyl glycol, polyvinyl alcohol and poly or copoly acrylates wherein at least part of the acrylate is a hydroxyalkyl acrylate such as poly(hydroxyethylacrylate) and copoly(hydroxyethylacrylate methylacrylate). Alicyclic polyols suitably employed in preparing the subject polyesters include cyclic alkanes having from five to seven atoms in the carbocyclic nucleus, 1,4-dihydroxymethylcyclohexane for example, and polyhydroxy-containing carbohydrates such as cellulosic compounds including substituted cellulose derivatives of which hydroxypropyl cellulose is an example. The unsaturated carboxylic acids from which these polyesters are advantageously derived include compositions having formulas selected from the group described by the general formula:

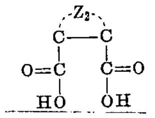

wherein $Z_2$ represents the atoms necessary to form an unsaturated, bridged or unbridged carbocyclic nucleus having from six to seven carbon atoms. Such carbocyclic nucleus can be substituted or unsubstituted. Particularly suitable acid units are 4-cyclohexane1,2-dicarboxylic acid, 5-norbornene-2,3-dicarboxylic acid and hexachloro-5[2:2:1]bicycloheptene-2,3-dicarboxylic acid. These unsaturated polycarboxylic acids readily polycondense with the above described polyols to form polyesters. Particularly suitable polyesters include, for example, the esterification products of polyvinyl alcohol and cis-4-cyclohexene-1,2-dicarboxylic acid; polyvinyl alcohol and 5-norbornene-1,2-dicarboxylic acid; hydroxypropycellulose and cis-4-cyclohexene-1,2-dicarboxylic acid; polyvinyl alcohol, benzoyl chloride and cis-4-cyclohexene-1,2-dicarboxylic acid; methyl acrylate-hydroxyethyl acrylate copolymer and cis-4-cyclohexene-1,2-dicarboxylic acid; ethylene glycol and cis-4-cyclohexene-1,2-dicarboxylic acid; ethylene glycol, maleic acid and cis-4-cyclohexene-1,2-dicarboxylic acid; ethylene glycol, and 5-norbornene-2,3-dicarboxylic acid; and ethylene glycol, cis-4-cyclohexene-1,2-dicarboxylic acid and hexachloro-5-[2:2:1] bicycloheptene-2,3-dicarboxylic acid. Additionally, amounts of other acids and acid salts can be incorporated into the reaction mixture to obtain particular polymer or reaction characteristics. A particular example of these polymers is poly(ethylene-cis-4-cyclohexene-1,2-dicarboxylate).

Other polymers which are advantageously employed with the present azido-substituted trihalomethanes in the negative-working elements of this invention include cyclized rubber compounds such as those described in British Pat. No. 767,985 and other rubber derivatives such as cyclized poly-cis-isoprene.

Coating the sensitized polymer onto the support material can be accomplished by coating means known to those skilled in the art. In the coating solution, the amount of azido-substituted trihalomethane sensitizer can vary from less than 5 percent by weight to over 40 percent by weight of the accompanying polymer, with between 10 and 30 weight percent of sensitizer to polymer being most advantageously utilized. The total weight of sensitizer and polymer can vary from less than 2 percent by weight to over 30 weight percent of the final coating solution. The particular percentage of solids at any given coating is dependent upon the use to which the photographic element will be applied. Coating thickness is also typically varied. The choice of support upon which the azido-substituted trihalomethane derivative sensitizer and polymer are coated can be widely varied, and is typically a function of that use to which the developed photographic element will be applied.

When the coated negative-working photographic elements are exposed to actinic light through an original pattern, the exposed polymer is cross-linked in conventional fashion by the azido-substituted trihalomethane sensitizer. Such cross-linking action renders the exposed polymer insoluble in certain of the solvents in which, prior to exposure, it had been soluble. This sort of differential solubility induced by cross-linking is typical of negative-working systems. The exposed areas of the polymer are also hydrophobic and greasy ink receptive.

Development is carried out with a suitable solvent or mixture of solvents such as the coating solvent composition, which dissolves away the polymer in the unexposed areas. The solvent varies between polymers, but the particular solvent in each case is easily determined by one skilled in the art. Treatment of the exposed element with developer solution can be accomplished by dipping, spraying, swabbing, and other techniques which permit the developed solvent to contact the exposed element for a period of time sufficient to selectively dissolve away the polymer in only the unexposed areas. After suitable development, the photographic element bears a polymer image which is a negative reproduction of the original pattern. This image is hydrophobic and ink receptive, and such developed photographic elements function advantageously both in photomechanical reproduction operations as masters for lithographic and relief printing, and as resist stencils for etching operations. A thinly coated element on a metal support may operate without additional treatment as a lithographic master, or it may be etched to provide a master for relief printing.

The light-sensitive layers in the above described negative-working photographic elements incorporate as a sensitizer an azido-substituted trihalomethane. These trihalomethane compounds complex with certain aromatic nuclei, particularly those containing a basic nitrogen atom, to give colored compositions. Such aromatic nuclei include, for example, leuco crystal violet, 4,4′,4″-methylidynestris(N,N-dimethylaniline), and 2-p-dimethylaminostyrylbenzothiazole. The addition of one of these compounds to a negative-working photographic element, such as those described above, gives a colored printout image upon irradiation with actinic light. This printout image is extremely convenient for inspection purposes. Its color will vary with the particular aromatic nuclei used to complex with the trihalomethane derivative, 4,4′,4″-methylidynetris(N,N-dimethylaniline) producing a blue printout image and 2-p-dimethylaminostyrylbenzothiazole an orange printout image.

The present azido-substituted trihalomethanes are also advantageously employed as sensitizers in positive-working photographic elements useful as masters for photomechanical reproduction and as resist stencils for etching operations. These positive-working elements are prepared by coating a support with a combination of the above noted sensitizer, an unsaturated polycarboxylic acid and a polymer.

Suitable unsaturated polycarboxylic acids for the positive-working elements include those having the formula:

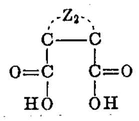

wherein $Z_2$ represents the atoms necessary to form an unsaturated, bridged or unbridged carbocylic nucleus having from six to seven carbon atoms. Such carbocyclic nucleus can be substituted or unsubstituted. Particularly useful polycarboxylic acids are 4-cyclohexene-1,2-dicarboxylic acid, 5-norbornene-2,3-dicarboxylic acid and hexachloro-[2:2:1]-bicycloheptene-2,3-dicarboxylic acid.

Polymers which are advantageously employed in the positive-working photographic elements described herein typically contain amide groups, and include I. homopolymers of recurring acryloylpeptide units having a formula selected from the group consisting of:

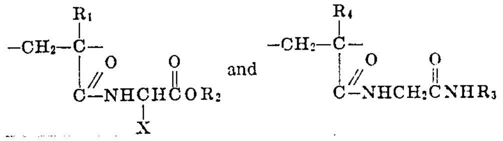

wherein:

A. $R_1$ is selected from the group consisting of:
1. a hydrogen atom and
2. a methyl radical;

B. $R_2$ is a lower alkyl radical;

C. $R_3$ is selected from the group consisting of:
1. an alkyl radical having up to seven carbon atoms, and
2. a radical having the formula $$-CH_2\overset{O}{\overset{\|}{C}}OR_5$$

wherein $R_5$ is a lower alkyl radical;

D. $R_4$ is selected from the group consisting of:
1. a hydrogen atom, and
2. a lower alkyl radical;

E. X is selected from the group consisting of:
1.

$$-CH_2CH_2\overset{O}{\overset{\|}{C}}OR_7$$

wherein $R_7$ is a lower alkyl radical;
2. a lower alkyl radical, and
3. a hydrogen atom; and II. copolymers comprising from 10 to 75 mole percent of at least one of said acryloylpeptide units and from 25 to 90 mole percent of at least one recurring unit having a formula selected from the group consisting of:

$$-CH_2-\underset{\underset{\displaystyle \overset{O}{\overset{\|}{C}}OR_9}{|}}{\overset{\overset{\displaystyle R_8}{|}}{C}}- \quad \text{and} \quad -CH_2-\underset{\underset{\displaystyle O-\overset{O}{\overset{\|}{C}}R_{10}}{|}}{CH}-$$

wherein:

A. $R_8$ is selected from the group consisting of:
1. a hydrogen atom, and
2. a lower alkyl radical; and B. $R_9$ and $R_{10}$ are each lower alkyl radicals.

Other suitable polymers are alkoxymethyl nylons, wherein the alkoxy substitutent typically varies from one to eight carbons.

Coating the mixture of polymer, unsaturated polycarboxylic acid and azido-substituted trihalomethane sensitizer upon a support can be accomplished by a wide variety of techniques. In the coating solution, the amount of azido-substituted trihalomethane derivative sensitizer can vary from less than 5 percent by weight to over 40 percent by weight of either the accompanying polymer or unsaturated polycarboxylic acid, which are typically used in equal quantities. The total weight of sensitizer, polymer, and acid can vary from less than 2 percent by weight to over 30 weight percent of the final coating solution, the particular percentage of solids in any given coating being dependent on the use to which the photographic element will be applied. Coating thickness is also typically varied as is the choice of a support material.

When these positive-working photographic elements are exposed to actinic light through an original pattern, the substantially alkali insoluble polymers are rendered suitably soluble (in the areas of exposure) in dilute aqueous alkaline solutions such as sodium hydroxide or trisodium phosphate. The mechanism of this reaction is not fully understood, but one explanation for the shift in solubility is a light-initiated reaction wherein the azido-substituted trihalomethane sensitizer links the unsaturated carboxylic acid to the polymer, thus attaching solubilizing acid groups to the polymer and imparting alkali solubility.

Development is carried out with a dilute alkaline solution, such as those noted above, which is susceptible of wide variations in concentration. Typically, the alkaline developing solutions vary from less than 1 percent to about 20 percent with the need for one concentration, rather than another, depending upon polymer concentrations, coating thickness and intensity of exposure.

Treatment of the positive-working exposed element with developer solution causes the highly alkali-soluble material in the exposed areas to dissolve away. This developing treatment can be accomplished by dipping, spraying, swabbing, and other techniques which permit the developer solvent to contact the exposed element for a period of time sufficient to selectively dissolve away the alkali-soluble polymer in the areas of exposure.

After development, the photographic elements bears a polymer image which is a positive reproduction of the original pattern. This image is hydrophobic and ink receptive, and such developed photographic elements function advantageously in photomechanical reproduction operations as masters for lithographic printing, as masters for relief printing and as resist stencils for etching operations.

Coating techniques available to prepare both the negative-working and positive-working elements described above are susceptible of wide variation and can be any of those known in the art. Whirler coating, dipping, swabbing, hopper coating and doctor blade coating are examples of suitably employed techniques. Coating thickness for both negative-working and positive-working elements is also a function of intended use and its limits are only those imposed by the concentration of the coating solution and the state of advancement attained by the coating art. Typically, coating thicknesses of between 1 mil and 4 mils are employed, but on an absorbent support material, coating thickness is not easily measured.

The choice of support upon which the above described mixtures for both types of elements are coated can be widely varied and is typically a function of that use to which the developed positive-working or negative-working photographic element will be applied. Metals, such as copper, tin, aluminum, zinc and the like can be used. Metal laminates, where a thin layer of a metal such as copper is bonded to a polymeric base material, are particularly suitable where subsequent etching is involved, such as in the production of printed circuits. Glass, and conventional photographic film bases such as cellulose acetate, polystyrene, cellulose nitrate, cellulose acetate butyrate, poly(ethyleneterephthalate), and paper including polyethylene-coated paper and polypropylene-coated paper are also advantageously employed as support materials in the practice of the invention described herein.

The negative-working and positive-working photographic elements described hereinabove exhibit utility in the photomechanical reproduction art. Such utility will become more obvious with a consideration of the following examples of preferred embodiments thereof, which serve to further illustrate the present invention.

EXAMPLE 1

6-Azido-5-bromo-2-tribromomethylquinoline is prepared from an intermediate, 6-acetamido-5-bromo-2-tribomomethylquinoline; which in turn is prepared from 6-acetamidoquinaldine. A mixture of 6-acetamidoquinaldine (21.0 g.), (Hamer, J. Chem. Soc., 119,1435) and anhydrous sodium acetate 90 in glacial acetic acid (210 ml.) is heated to 70° C. and a solution of bromine (67.2 g.) in glacial acetic acid (90 ml.) is added for 30 minutes, with stirring. After addition, the temperature is raised to 92° C., and heating is continued for 90 minutes. The reaction mixture is cooled to room temperature and allowed to stand overnight. The crystalline solid is filtered off, washed with a little acetic acid and finally washed well with water to give 49.5 g. (95 percent) of product. One crystallization from glacial acetic gives pure material (45.0 g.) m.p. 194–5 ° C. with decomposition. The 6-acetamido-5-bromo-2-tribromomethylquinoline (3 g.) is gradually added at room temperature of 98 percent sulfuric acid (9 ml.) with stirring. The clear solution is heated on a steam bath for ten minutes and then cooled to 15° C. Solid sodium nitrite (0.41 g.) is gradually added and stirring is continued for 30 minutes. The reaction mixture is poured onto ice (50 g.) and allowed to stand at 0° C. for 30 minutes. The pale yellow crystalline diazonium salt is filtered off, washed with a little ice cold 25 percent sulfuric acid and immediately dissolved, while still damp, in water (100 ml.) at room temperature. Addition of sodium azide (0.4 g.) dissolved in water (25 ml.) gives an immediate precipitate. The mixture is stirred for 30 minutes at room temperature and the product is collected (2.0 g.). One crystallization from alcohol gives pure material (1.6 g.) m.p. 127–8° C.

EXAMPLE 2

8-Azido-5,7-dibromo-2-tribromomethylquinoline is prepared from an intermediate, 8-acetamido-5,7-dibromo-2-tribomomethylquinoline, which in turn is prepared from 8-acetamidoquinaldine. A mixture of 8-acetamidoquinaldine (7 g.) and anhydrous sodium acetate (30 g.) in glacial acetic acid (74 ml.) is heated to 70° C. and a solution of bromine (28 g.) in glacial acetic acid (24 ml.) is added over 30 minutes with stirring. After addition, the temperature is raised to 95° C. and heating is continued for 90 minutes. The reaction mixture is then cooled to room temperature and the product filtered off. The material is washed well with water and recrystallized from glacial acetic acid to give pure 8-acetamido-5,7-dibromo-2-tribromomethylquinoline (10.6 g.), m.p. 191–2° C. with decomposition. A portion (3 g.) is then dissolved in 98 percent concentrated sulfuric acid (9 ml.) and the solution is heated in a steam bath for 10 minutes. The solution is then cooled to about 25° C. and solid sodium nitrite (0.35 g.) is added with stirring. The mixture is stirred for 90 minutes at about 25° C. and is then poured, in a slow stream and with stirring, into a solution of sodium azide (0.40 g.) in ice water (200 g.). The precipitate is filtered off and crystallized from dimethylformamide to give pure 8-azido-5,7-dibromo-2-tribromomethylquinoline m.p. 135° C. with decomposition.

EXAMPLE 3

6-azido-7-bromo-2-tribromomethylbenzothiazole is prepared from an intermediate, 6-acetamido-7-bromo-2-tribromomethylbenzothiazole according to the procedure of example 1, except that 6-acetamido-2-methylbenzothiazole (21.6 g.) is used to prepare the 6-acetamido-7-bromo-2-tribromomethylbenzothiazole which is obtained by a final crystallization from ethanol/water 1:1 and has a m.p. of 158°–60b*L* C. The 6-acetamido-7-bromo-2-tribromomethyl benzothiazole (3.0 g.) is then used to prepare the 6-azido-7-bromo-2-tribromomethylbenzothiazole which is crystallized from 60°–80° C. petroleum ether with a m.p. of 127–9° C. with decomposition.

EXAMPLE 4

5-Azido-6,8-dibromo-2-tribromomethylquinoline is prepared from an intermediate, 5-acetamido-6,8-dibromo-2-tribromomethylquinoline, according to the procedure of example 2, except that 5-acetamidoquinaldine (7 g.) is used to prepare the intermediate which is recrystallized from glacial acetic acid and has a m.p. of 221–2° C. The 5-acetamido-6,8-dibromo-2-tribromomethylquinoline (3 g.) is then used to prepare the 5-azido-6,8-dibromo-2-tribromomethylquinoline which is recrystallized from glacial acetic acid and has a m.p. of 124–6° C. with decomposition.

EXAMPLE 5

A sheet of flexible poly(ethylene terephthalate) copper laminate is whirler coated at 200 r.p.m. with the following solution:

| | |
|---|---|
| Copoly(methyl acrylate, N-acryloyl-N'-butylglycinamide) | 0.4 g. |
| Cis-4-Cyclohexene-1,2-dicarboxylic acid | 0.4 g. |
| 2,6-bis-(p-ethoxyphenyl)-4-(p-n-amyloxyphenyl)thiapyrylium perchlorate (1 % solution in cyclohexanone) | 4 ml. |
| 6-Azido-5-bromo-2-tribromomethylquinoline | 0.05 g. |
| Cyclohexanone | 16 ml. |

The dry layer is exposed for 2 minutes through an original pattern to four 125-watt high pressure mercury vapor lamps rich in ultraviolet light, placed 18 inches from the exposing plane. The exposed sheet is developed by immersion in a 2 percent aqueous sodium hydroxide solution for 20 seconds followed by a water rinse. The exposed areas visibly swell and are removed by swabbing with cotton wool. The developed element is then etched by spraying with 35° Bé ferric chloride, no degradation of the polymer image occurring. Similar results are obtained when 5-norbornene-2,3-dicarboxylic acid is substituted for the 4-cyclohexene-1,2-dicarboxylic acid.

EXAMPLE 6

A sheet of flexible poly (ethylene terephthalate) copper laminate is whirler coated at 200 r.p.m. with the following solution:

| | |
|---|---|
| Poly(ethylene-cis-4-cyclohexene-(1,2-dicarboxylate) | 0.5 g. |
| 6-Azido-5-bromo-2-tribromemethylquinoline | 0.1 g. |
| Cyclohexanone-ethyl alcohol (1:1) | 10 ml. |

The dried layer is exposed through an original pattern for 20 minutes as described in example 5 and developed by spraying with ethyl alcohol containing 20 percent cyclohexanone. The unexposed areas are dissolved away during development. The developed element is then etched by spraying with 35° Bé ferric chloride. No degradation of the polymer image occurs.

EXAMPLE 7

A sheet of flexible poly(ethylene terephthalate) copper laminate is whirler coated at 200 r.p.m. with the following composition:

| | |
|---|---|
| 10 % solution of cyclized poly-cis-isoprene in xylene | 5 ml. |
| 6-Azido-5-bromo-2-tribromomethylquinoline | 0.1 g. |
| Cyclohexanone | 3 ml. |

The dried layer is exposed as in example 5 through an original pattern of a printed circuit for 10 minutes and then is developed in a mixture of ethanol and cyclohexanone, to which a methyl violet dye is added, for 60 seconds, followed by water spray and drying. The unprotected copper is removed by spraying with 35° Bé ferric chloride. No degradation of the polymer image occurs.

EXAMPLE 8

The procedure is like that of example 7, except that 0.1 g. of Leuco Crystal Violet [4,4', 4''-methylidynetris-(N,N-dimethylaniline)] is added. Upon exposure, a blue printout image occurs in the light exposed areas. After development the exposed imagewise polymer image is dark blue.

EXAMPLE 9

The procedure is like that of example 7, except that 0.1 g. of 2-p-dimethylaminostyrylbenzothiazole is added to the coating solution. Upon exposure to actinic light, an intense orange printout image occurs. After development, the exposed, imagewise distribution of polymer is orange.

EXAMPLE 10

A sheet of flexible poly(ethylene terephthalate) copper laminate is whirler coated at 200 r.p.m. with the following solution:

| | |
|---|---|
| 7.5% solution of cyclized rubber of the type described in U.S. Pat. Nos. 1,605,180 and 1,668,235 (Thermoprene 93 marketed by B.T.R. Industries Ltd., Great Britain) in xylene | 10 ml. |
| 6-Azido-5-bromo-2-tribromomethylquinoline | 0.2 g. |

The dried coating is exposed for 8 minutes as described in example 7 and developed in a similar fashion. The unexposed areas are dissolved away during development, and the unprotected copper is removed by spraying with 35° Bé ferric chloride. No degradation of the polymer image occurs.

EXAMPLE 11

Three elements are prepared, exposed and developed according to the procedure of example 10, except that the 6-azido-5-bromo-2-tribromomethylquinoline is replaced in the three respective elements by equal weights of:

1. 6-azido-7-bromo-2-tribromomethylbenzothiazole 2. 8-azido-5,7-dibromo-2-tribromomethylquinoline, and
3. 5-azido-6,8-dibromo-2-tribromomethylquinoline.

After removing unprotected copper by spraying with 38° Bé ferric chloride, the polymeric image is not degraded.

Although the invention has been described in considerable detail with reference to certain preferred embodiments thereof, it will be understood that variations and modifications can be effected without departing from the spirit and scope of the invention as described hereinabove and as defined in the appended claims.

We claim:

1. A photographic element comprising a support having coated thereon a light-sensitive layer comprising a polymer having unsaturation and a sensitizing amount of an azido-substituted trihalomethane sensitizer having a formula selected from the group consisting of:

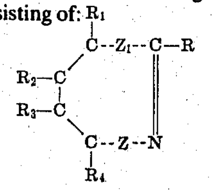

and

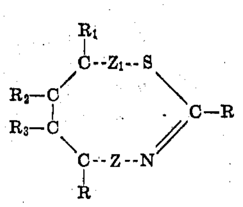

wherein:

a. R is a trihalomethyl radical
b. each of $R_1$, $R_2$, $R_3$ and $R_4$ is selected from the group consisting of an azido radical, a halogen atom and a hydrogen atom, and of $R_1$, $R_2$, $R_3$ and $R_4$ at least two adjacent members are an azido radical and a halogen atom, and
c. Z and $Z_1$ in combination with the atoms to which they are attached in said formula form a quinoline or benzothiazole nucleus, said polymer being one that, in the presence of said sensitizer, is cross-linked on exposure to provide a hydrophobic polymer image that accepts a greasy ink.

2. A photographic element as described in claim 1 wherein the azido-substituted trihalomethane sensitizer has a formula selected from the group consisting of:

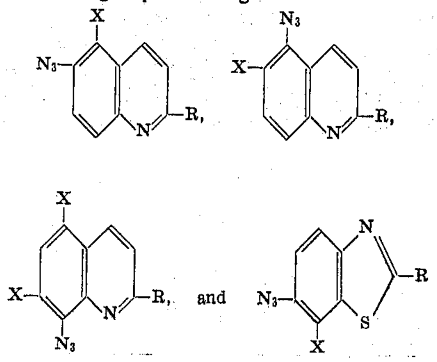

wherein R is a trihalomethyl radical and X is a halogen atom.

3. A photographic element as described in claim 1 wherein the azido-substituted trihalomethane sensitizer is selected from the group consisting of:

a. 6-azido-5-bromo-2-tribromomethylquinoline,
b. 5-azido-6,8-dibromo-2-tribromomethylquinoline,
c. 8-azido-5,7-dibromo-2-tribromomethylquinoline, and
d. 6-azido-7-bromo-2-tribromomethylbenzothiazole.

4. A photographic element as described in claim 1 wherein the polymer is a polyester derived from a polyol and an unsaturated polycarboxylic acid and wherein:

A. the polyol is selected from the group consisting of lower alkane glycols, homopolymers and copolymers of polyhydroxy substituted lower alkyl acrylate esters, polyhydroxy substituted cyclic alkanes and polyhydroxy substituted carbohydrates, and
B. the unsaturated polycarboxylic acid has a formula selected from the group consisting of:

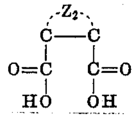

wherein $Z_2$ represents the atoms necessary to form an unsaturated carbocyclic nucleus having from six to seven carbon atoms.

5. A photographic element as described in claim 1 wherein the polymer is cyclized rubber.

6. A photographic elements as described in claim 1 wherein the support comprises a thin layer of copper laminated onto a polymeric support material.

7. A photographic element comprising a support having coated thereon a light-sensitive layer comprising a substantially alkali insoluble polymer containing amide groups, an unsaturated polycarboxylic acid and a sensitizing amount of an azido-substituted trihalomethane sensitizer having a formula selected from the group consisting of:

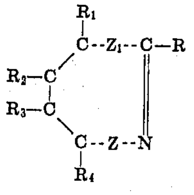

and

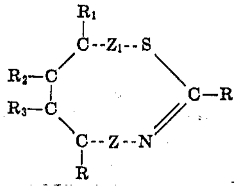

wherein:

a. R is a trihalomethyl radical
b. each of $R_1$, $R_2$, $R_3$ and $R_4$ is selected from the group consisting of an azido radical, a halogen atom and a hydrogen atom, and of $R_1$, $R_2$, $R_3$ and $R_4$, at least two adjacent members are an azido radical and a halogen atom, and
c. Z and $Z_1$ in combination with the atoms to which they are attached in said formula form a quinoline or benzothiazole nucleus.

8. A photographic element as described in claim 7 wherein the azido-substituted trihalomethane sensitizer has a formula selected from the group consisting of:

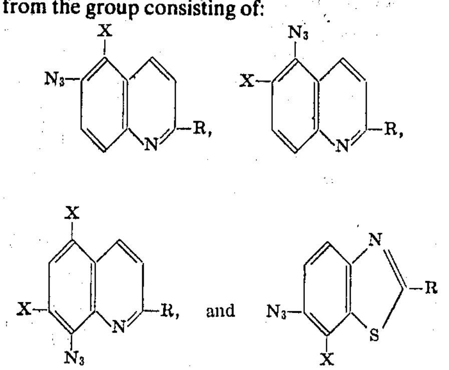

wherein R is a trihalomethyl radical and X is a halogen atom.

9. A photographic element as described in claim 8 wherein the azido-substituted trihalomethane sensitizer is selected from the group consisting of:

a. 6-azido-5-bromo-2-tribromomethylquinoline,
b. 5-azido-6,8-dibromo-2-tribromomethylquinoline,
c. 8-azido-5,7-dibromo-2-tribromomethylquinoline, and
d. 6-azido-7-bromo-2-tribromomethylbenzothiazole.

10. A photographic element as described in claim 7 wherein the polymer is a compound having a formula selected from the group consisting of:

I. homopolymers of recurring acryloylpeptide units having a formula selected from the group consisting of:

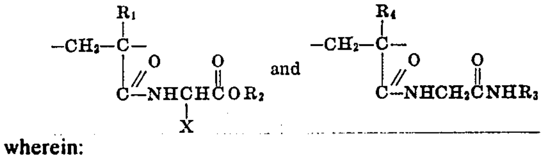

wherein:

A. $R_1$ is selected from the group consisting of:
1. a hydrogen atom and
2. a methyl radical;

B. $R_2$ is a lower alkyl radical;

C. $R_3$ is selected from the group consisting of:
1. an alkyl radical having up to seven carbon atoms, and
2. a radical having the formula $$-CH_2\overset{O}{\overset{\|}{C}}OR_5,$$

wherein $R_5$ is a lower alkyl radical;

D. $R_4$ is selected from the group consisting of:
1. a hydrogen atom, and
2. a lower alkyl radical;

E. X is selected from the group consisting of:
1.

$$-CH_2CH_2\overset{O}{\overset{\|}{C}}OR_7,$$

wherein $R_7$ is a lower alkyl radical;
2. a lower alkyl radical,
3. a hydrogen atom; and II. copolymers comprising from 10 to 75 mole percent of at least one of said acryloylpeptide units and from 25 to 90 mole percent of at least one recurring unit having a formula selected from the group consisting of:

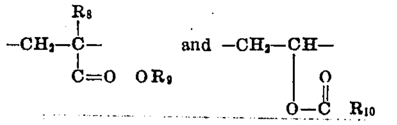

wherein:

A. $R_8$ is selected from the group consisting of:
1. a hydrogen atom, and
2. a lower alkyl radical; and B. $R_9$ and $T_{10}$ are each lower alkyl radicals.

11. A photographic element as described in claim 9 wherein the polymer comprising alkoxymethylnylon, which alkoxy radical has two to eight carbon atoms.

12. A photographic element as described in claim 7 wherein the unsaturated polycarboxylic acid has the formula:

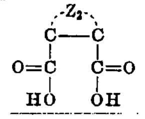

wherein $Z_2$ represents the atoms necessary to form an unsaturated carbocyclic nucleus having from six to seven carbon atoms.

13. A photographic element as described in claim 7 wherein the support comprises a thin layer of copper laminated onto a polymeric support material.

14. A photographic process for treating an imagewise exposed photographic element comprising a support having coated thereon a light-sensitive layer comprising a polymer having unsaturation and a sensitizing amount of an azido-substituted trihalomethane having a formula selected from the group consisting of:

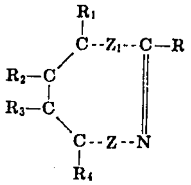

and

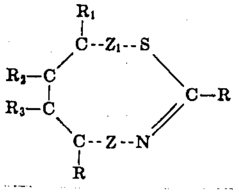

wherein:

a. R is a trihalomethyl radical b. each of $R_1$, $R_2$, $R_3$ and $R_4$ is selected from the group consisting of an azido radical, a halogen atom and a hydrogen atom, and of $R_1$, $R_2$, $R_3$ and $R_4$, at least two adjacent members are an azido radical and a halogen atom, and c. Z and $Z_1$ in combination with the atoms to which they are attached in said formula form a quinoline or benzothiazole nucleus, said polymer being one that in the presence of said sensitizer, is cross-linked on exposure to provide a hydrophobic polymer that accepts a greasy ink, such process comprising contacting said photographic element with a solvent for said unexposed polymer for a period of time sufficient to selectively remove the light-sensitive layer in the unexposed areas.

15. A photographic process for treating an imagewise exposed photographic element comprising a support having coated thereon a light-sensitive layer comprising a substantially alkali insoluble polymer containing amide groups, an unsaturated polycarboxylic acid and a sensitizing amount of an azido-substituted trihalomethane sensitizer having a formula selected from the group consisting of:

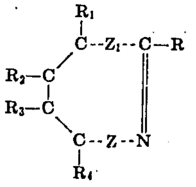

and

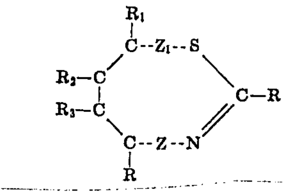

wherein:

a. R is a trihalomethyl radical, b. each of $R_1$, $R_2$, $R_3$ and $R_4$ is selected from the group consisting of an azido radical, a halogen atom and a hydrogen atom, and a $R_1$, $R_2$, $R_3$ and $R_4$at least two adjacent members are an azido radical and a halogen atom, and c. Z and $Z_1$ in combination with the atoms to which they are attached in said formula form a quinoline or benzothiazole nucleus. such process comprising contacting said photographic element with a dilute alkaline solution for a time sufficient to selectively remove exposed areas of said layer, leaving an ink receptive polymer image in unexposed areas.

* * * * *

PO-1050
(5/69)

UNITED STATES PATENT OFFICE
CERTIFICATE OF CORRECTION

Patent No. 3,617,278 Dated November 2, 1971

Inventor(s) Colin Holstead and Wojciech M. Przezdziecki

It is certified that error appears in the above-identified patent and that said Letters Patent are hereby corrected as shown below:

In each of Column 2, lines 15 to 21, Column 9, lines 25 to 31, Column 10, lines 35 to 41, Column 12, lines 10 to 16 and Column 12, lines 53 to 59, that portion of the formula reading C--Z over R should read C--Z over $R_4$ In each of Column 2, lines 32 to 38, Column 9, lines 48 to 54 and Column 10, lines 54 to 60, that portion of the right-hand formula reading

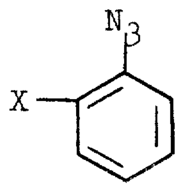

should read

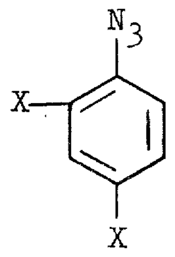

In each of Column 2, lines 40 to 46, Column 9, lines 56 to 62, and Column 10, lines 62 to 68, that portion of the right-hand formula reading

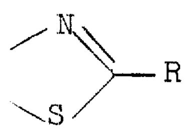

should read

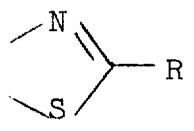

PO-1050
(5/69)

UNITED STATES PATENT OFFICE
CERTIFICATE OF CORRECTION

Patent No. 3,617,278 Dated November 2, 1971

Inventor(s) Colin Holstead and Wojciech M. Przezdziecki

It is certified that error appears in the above-identified patent and that said Letters Patent are hereby corrected as shown below:

Column 6, line 51, "90" should be -- (90 g.)--.

Column 11, line 53, "$T_{10}$" should be --$R_{10}$--.

Column 11, line 54, "9" should be --7--.

Column 11, line 55, "comprising" should be --comprises--.

Signed and sealed this 19th day of September 1972.

(SEAL)
Attest:

EDWARD M.FLETCHER,JR.
Attesting Officer

ROBERT GOTTSCHALK
Commissioner of Patents